United States Patent
Kikuchi

(10) Patent No.: US 9,184,062 B2
(45) Date of Patent: Nov. 10, 2015

(54) METAL FILLING DEVICE

(75) Inventor: Tatsuo Kikuchi, Hyogo (JP)

(73) Assignee: Sumitomo Precision Products Co., LTD., Hyogo (JP)

( * ) Notice: Subject to any disclaimer, the term of this patent is extended or adjusted under 35 U.S.C. 154(b) by 0 days.

(21) Appl. No.: 14/343,650

(22) PCT Filed: Sep. 14, 2012

(86) PCT No.: PCT/JP2012/073634
§ 371 (c)(1),
(2), (4) Date: Mar. 7, 2014

(87) PCT Pub. No.: WO2013/042629
PCT Pub. Date: Mar. 28, 2013

(65) Prior Publication Data
US 2014/0224445 A1  Aug. 14, 2014

(30) Foreign Application Priority Data
Sep. 21, 2011  (JP) .................................. 2011-206026

(51) Int. Cl.
| B22D 19/00 | (2006.01) |
| B22D 45/00 | (2006.01) |
| H01L 21/3205 | (2006.01) |
| C23C 6/00 | (2006.01) |
| B22D 19/08 | (2006.01) |
| B22D 39/02 | (2006.01) |
| H01L 21/768 | (2006.01) |

(52) U.S. Cl.
CPC .......... *H01L 21/32051* (2013.01); *B22D 19/00* (2013.01); *B22D 19/08* (2013.01); *B22D 39/02* (2013.01); *B22D 45/00* (2013.01); *C23C 6/00* (2013.01); *H01L 21/768* (2013.01); *H01L 21/76898* (2013.01)

(58) Field of Classification Search
CPC .......... B22D 19/00; B22D 45/00; C23C 6/00; H01L 21/28; H01L 21/3205; H01L 21/32051; H01L 21/768
USPC ........................................ 164/75, 91, 98, 332
See application file for complete search history.

(56) References Cited

U.S. PATENT DOCUMENTS

| 4,175,725 A * | 11/1979 | Cattano ........................... 249/81 |
| 2009/0130529 A1* | 5/2009 | Yamamoto et al. ............. 429/34 |
| 2010/0126688 A1 | 5/2010 | Sekine et al. |
| 2010/0301485 A1 | 12/2010 | Sekine et al. |

FOREIGN PATENT DOCUMENTS

| JP | 06-275557 A | | 9/1994 |
| JP | 06275557 A | * | 9/1994 |
| JP | 2002-368082 A | | 12/2002 |
| JP | 2002-368083 A | | 12/2002 |
| JP | 2010-232641 A | | 10/2010 |

* cited by examiner

Primary Examiner — Kevin E Yoon
(74) Attorney, Agent, or Firm — Miller, Matthias & Hull LLP

(57) ABSTRACT

A metal filling apparatus fills molten metal into a minute space formed on a surface of a semiconductor wafer. The apparatus has a processor body with a chamber in which the wafer is held, a molten metal supply, and a molten metal recovery mechanism. The supply includes a tank in which molten metal is stored, a supply pipe connected between the chamber and the tank, a supplier interposed in the supply pipe to supply molten metal from the tank to the processing chamber, and the recovery mechanism recovers molten metal from the processing chamber.

15 Claims, 7 Drawing Sheets

METAL FILLING DEVICE

CROSS-REFERENCE TO RELATED APPLICATIONS

This application is a U.S. National Stage filing under 35 USC §371 of International Patent Application No. PCT/JP2012/073634 filed on Sep. 14, 2012. This application also claims priority under the Paris Convention to Japanese Application No. 2011-206026, filed on Sep. 21, 2011.

FIELD OF THE DISCLOSURE

The present invention relates to a metal filling apparatus filling a molten metal into a minute space formed on a surface of an object to be processed, e.g., a semiconductor wafer, and particularly relates to a metal filling apparatus recovering excess molten metal at the time of filling a molten metal.

BACKGROUND OF THE DISCLOSURE

In recent years, in the through silicon via technology, there has been desired a technique of filling a metal into a minute space provided on a semiconductor wafer. Because the through silicon via technology makes it possible to develop a chip stacking technology using through hole electrode, it is expected that a high-performance and high-speed semiconductor system is achieved by a three-dimensional stacked integrated circuit. In order to secure stable conduction in a through silicon via, it is required to perform metal filling with high yield without any defects such as a crack and a void.

Conventionally, as a technique of filling a metal into a minute space on a semiconductor wafer, besides copper plating methods and dipping methods in which a semiconductor wafer is immersed in a molten metal tank, there is suggested, as shown in the Patent documents 1 and 2, a melting and vacuum-sucking method in which, in a pressure-reduced chamber, a metal body for filling is arranged on a surface of a sample, where a minute space to be filled with a metal is formed, so that the metal body for filling covers the minute space, and the metal body for filling is heated and melted, and then the inside of the vacuum chamber is pressurized to a pressure equal to or greater than atmospheric pressure by an inert gas, thereby causing the molten metal to be vacuum-sucked into the minute space.

SUMMARY OF THE DISCLOSURE

Using the above-described melting and vacuum-sucking method, it is possible to cause the molten metal to be vacuum-sucked into the minute space by pressure difference generated between the inside of the minute space formed on the semiconductor wafer and the inside of the chamber, but actually the surface tension and the interfacial tension of the molten metal and the like are inhibiting factors for good vacuum suction.

As a method for suppressing the effects of the surface tension of a molten metal and poor wettability of a semiconductor wafer surface to achieve good metal filling, there is known a method of covering a surface of a semiconductor wafer as a sample with a large amount of molten metal when using a melting and vacuum-sucking method. Particularly in a case where a silicon wafer (semiconductor wafer) and a molten solder alloy are used, because the wettability on the silicon wafer is poor, the molten solder alloy is not spread on the wafer and is brought into a spherical shape unless the surface of the silicon wafer is covered with a large amount of and excess solder alloy.

When a trial calculation was made of how much of a molten metal used as the material was actually filled into a minute space on a semiconductor wafer in a typical melting and vacuum-sucking method, although depending on the formation state of the minute space and filling conditions, it was less than 1% of the amount supplied, which is the current state of the art.

That is, in the prior art, in spite of the fact that it is necessary to prepare a large amount of molten metal for use, only a very small amount of the molten metal is actually used, and a large amount of excess molten metal which was not used is regarded as an unnecessary substance and removed from the surface of the semiconductor wafer and the inside of the device. Accordingly, in the prior art, the metal material used is mostly wasted and this is a factor of reduction of cost efficiency in metal filling.

The present invention has been achieved in view of the above-described circumstances and an object thereof is to provide a metal filling apparatus which reduces waste of metal material by utilizing a metal which is not filled into a minute space of an object to be processed, e.g., a semiconductor wafer, thereby achieving a low-cost metal filling.

The present invention, for achieving the above-described object, relates to a metal filling apparatus filling a molten metal into a minute space formed on a surface of an object to be processed to have an opening in said surface, comprising:

a processor body equipped with a processing chamber in which the object to be processed is held; and a molten metal supply mechanism including a supply tank in which a metal is stored in a molten state, a supply pipe one end of which is connected to the supply tank and the other end of which is connected to the processing chamber of the processor body, and a supplier which is interposed in the supply pipe and which supplies the molten metal in the supply tank into the processing chamber through the supply pipe, wherein the metal filling apparatus has a molten metal recovery mechanism recovering the molten metal supplied into the processing chamber from the processing chamber. It is noted that the expression "interposed in a pipe" means that an object (in the above, the supplier) is arranged so that the object is interposed between both ends of the pipe, that is, at an intermediate portion.

In the present invention, typically the minute space formed on the object to be processed is assumed to have a diameter of 0.1 µm to several tens of µm. Further, the method of forming the minute space and the morphological characteristics of the minute space such as aspect ratio do not matter as long as a molten metal can be filled thereinto, and it also does not matter whether or not the minute space is a through hole. When the minute space is not a through hole, it may have an arbitrary depth equal to or lower than several hundreds of µm in accordance with the thickness of the object to be processed.

According to the present invention having the above-described configuration, an object to be processed having a minute space formed on a surface thereof is held in the processing chamber of the processor body. Then, the metal in a molten state (in a liquid form) stored in the supply tank is supplied into the processing chamber through the supply pipe by the supplier of the molten metal supply mechanism. The surface of the object to be processed is covered by the thus supplied molten metal and the molten metal is filled into the minute space.

Thereafter, excess metal in a molten state on the object to be processed is recovered from the surface of the object to be processed by the molten metal recovery mechanism.

Thus, according to the present invention, since excess metal on the object to be processed can be recovered from the surface of the object to be processed by the molten metal recovery mechanism, it is possible to reduce waste of a metal material used, and therefore it is possible to reduce material costs in metal filling.

It is noted that, in the present invention, various modes can be employed as a mode of supplying the molten metal onto the object to be processed and filling the molten metal into the minute space. For example, a mode in which the molten metal is supplied onto the object to be processed after reducing the pressure inside the processing chamber, or a mode in which, after covering the surface of the object to be processed with the molten metal, the molten metal on the object to be processed is pressurized by an appropriate pressurizing mechanism and thereby the molten metal is filled into the minute space may be employed. In this way, a clearance and a void hardly occur in the metal filled into the minute space, and therefore it is possible to perform better filling.

Further, in a first specific mode of the present invention, the processor body has a recess portion to be the processing chamber and includes a first body holding the object to be processed within the recess portion, and a second body having a pressing portion to be airtightly fitted into the recess portion, and the metal filling apparatus further has a pressing mechanism moving at least one of the first and second bodies in directions to cause them to approach each other and to separate them from each other. In this case, the pressing mechanism functions as a part of the molten metal recovery mechanism.

According to the metal filling apparatus having this configuration, first, an object to be processed is held in the recess portion of the first body, and then the second body is assembled to the first body so that the pressing portion of the second body is fitted into the recess portion, and thereby turning the recess portion into an airtight processing chamber. Thereafter, the molten metal is supplied into the processing chamber by the supplier. Thus, the surface of the object to be processed is covered by the thus supplied molten metal. It is noted that it is preferred that, at the time of supplying the molten metal into the processing chamber, the molten metal is supplied so that the processing chamber is filled with the molten metal. Further, as described above, the pressure inside the processing chamber may be reduced by an appropriate pressure reducing mechanism before supplying the molten metal onto the object to be processed.

Subsequently, at least one of the first and second bodies is moved by the pressing mechanism so that they approach each other. Thereby, the molten metal in the processing chamber is pressurized and the molten metal is filled into the minute space formed on the object to be processed.

Furthermore, when the first and second bodies are brought closer to each other by the pressing mechanism, the capacity of the processing chamber is reduced and the molten metal filling the processing chamber is pressed out from the inside of the processing chamber, and the molten metal pressed out is recovered by the molten metal recovery mechanism. In this sense, the pressing mechanism functions as a part of the molten metal recovery mechanism.

It is noted that, in this case, it is preferred that the pressing mechanism is configured to move to at least one of the first and second bodies to a pressing position at which the pressing portion of the second body is brought into contact with the surface of the object to be processed in the first body and to a waiting position at which the first and second bodies are separated from each other. In this configuration, by bringing the pressing portion of the second body into contact with the surface of the object to be processed, excess metal which has not been filled into the minute space and remains on the object to be processed can be discharged from the surface of the object to be processed as much as possible and thereby the amount thereof can be made very small, and therefore material costs necessary for metal filling can be reduced to the utmost limit. Further, it is possible to minimize labor of removing an unnecessary cured metal after cooling.

Further, in a second mode of the present invention, the processor body includes a holding member holding the object to be processed, a cylindrical member having an inner space and provided to have one end facing the holding portion, and a pressing member airtightly inserted in the inner space of the cylindrical member to be movable forward and backward, the metal filling apparatus further has a gas supply mechanism supplying a pressurized gas into the processing chamber and a pressing mechanism moving the pressing member forward and backward with respect to the object to be processed held by the holding member, and the pressing mechanism is configured to move the pressing member to a pressing position at which the pressing member is brought into contact with the surface of the object to be processed and to a waiting position at which the pressing member is separated from the object to be processed. In this case, an airtight processing chamber is formed by the object to be processed held by the holding member or the holding member, the cylindrical member and the pressing member, and the gas supply mechanism functions as a part of the molten metal recovery mechanism.

According to this metal filling apparatus, first, an object to be processed is held by the holding member, and then an airtight processing chamber is formed by the holding member, the cylindrical member and the pressing member. Subsequently, the molten metal is supplied into the processing chamber by the supplier and the surface of the object to be processed is covered by the molten metal. It is noted that, similarly to the first mode, the pressure inside the processing chamber may be reduced by an appropriate pressure reducing mechanism before supplying the molten metal onto the object to be processed. Further, although it is necessary to cover the entire of the surface of the object to be processed with the molten metal, the supply amount of the molten metal is not necessarily such an amount that the processing chamber is filled therewith. However, it is preferred that such an amount of the molten metal that at least the lower surface of the pressing member is sunk in the molten metal is supplied.

Subsequently, a pressurized gas is supplied into the processing chamber by the gas supply mechanism, thereby pressurizing the molten metal in the processing chamber. Thereby, the molten metal on the object to be processed is pressed into the minute space and filled thereinto. Thereafter, the pressing member is moved forward toward the object to be processed by the pressing mechanism and thereby the pressing member is brought into contact with the surface of the object to be processed. Thereby, the amount of excess metal which has not been filled into the minute space and remains on the object to be processed can be made very small.

Subsequently, for example, by causing the gas supply mechanism to supply into the processing chamber a gas of a pressure higher than the pressure of the molten metal supplied by the supplier, excess molten metal in the processing chamber is pressed out from the processing chamber and is recovered by the molten metal recovery mechanism. In this sense, the gas supply mechanism functions as a part of the molten metal recovery mechanism.

Thus, also according to the metal filling apparatus of the second mode, the amount of excess metal which has not been filled into the minute space and remains on the object to be processed can be made very small and material costs necessary for metal filling can be reduced to the utmost limit. Further, it is possible to minimize labor of removing an unnecessary cured metal after cooling.

It is noted that, in this case, it is preferred that the pressing member has a sealing member on its surface to be brought into contact with the object to be processed, the sealing member, when the pressing member is brought into contact with the object to be processed, surrounding and sealing a region in which the minute space formed on the surface of the object to be processed exists. In this configuration, when supplying a gas into the processing chamber from the gas supply mechanism and discharging excess metal from the inside of the processing chamber, since the region in which the minute space on the object to be processed exists can be sealed by the sealing member, the sealed region is separated from the region from which excess metal is discharged, and therefore it is possible to prevent the occurrence of problems such as that the metal filled into the minute space is slipped out together with the discharge of the excess metal.

In the above-described metal filling apparatuses of the first and second modes, the molten metal recovery mechanism may include a recovery pipe one end of which is connected to the supply pipe between the processor body and the supplier or to the processing chamber of the processor body and the other end of which is connected to the supply tank, and a control valve for recovery which is interposed in the recovery pipe and controls an open and closed state of the recovery pipe. In this configuration, the molten metal discharged from the processing chamber is recovered into the supply tank through the recovery pipe and reused. It is noted that the control valve for recovery provided in the recovery pipe closes the recovery pipe when supplying the molten metal into the processing chamber from the supplier, and opens the recovery pipe when recovering excess molten metal into the supply tank.

In this case, the molten metal recovery mechanism may further comprise a buffer tank which is connected to the recovery pipe between the control valve for recovery and the supply pipe or processor body or to the supply pipe between the processor body and the supplier and which temporally contains the molten metal recovered from the processor body, the buffer tank being equipped with a push-back device pushing the molten metal contained in the buffer tank back to the pipe connected thereto.

According to the metal filling apparatus having this buffer tank, the molten metal recovered from the processor body is temporally contained in the buffer tank, and the molten metal contained is pushed back to the pipe connected to the buffer tank, that is, the recovery pipe or the supply pipe, by the push-back device and recovered into the supply tank through the recovery pipe.

Alternatively, the molten metal recovery mechanisms of the first and second modes may include a recovery tank in which a metal in a molten state is stored, a recovery pipe one end of which is connected to the supply pipe between the processor body and the supplier or to the processing chamber of the processor body and the other end of which is connected to the recovery tank, and a control valve for recovery which is interposed in the recovery pipe and controls an open and closed state of the recovery pipe. In this configuration, the molten metal discharged from the processing chamber is recovered into the recovery tank through the recovery pipe. It is noted that the control valve for recovery provided in the recovery pipe closes the recovery pipe when supplying the molten metal into the processing chamber from the supplier, and opens the recovery pipe when recovering excess molten metal into the supply tank.

In this case, the molten metal recovery mechanism may further have a return pipe one end of which is connected to the recovery tank and the other end of which is connected to the supply tank, and a returner which is interposed in the return pipe and returns the molten metal in the recovery tank to the supply tank through the return pipe. In this configuration, the excess molten metal recovered into the recovery tank is returned to the supply tank through the return pipe by the returner and reused.

Alternatively, the metal filling apparatuses of the first and second modes may have a configuration in which the supplier is configured to be capable of accepting the molten metal flowing back and functions as a part of the molten metal recovery mechanism. In this case, the molten metal recovered from the processor body by the molten metal recovery mechanism is temporally accepted by the supplier and then returned from the supplier to the supply tank through the supply pipe.

It is noted that it is preferred that the path of recovering the molten metal is configured to be airtight so that the molten metal is not exposed to outside air. When thus configured, it is possible to prevent alternation and deterioration of the recovered molten metal caused by being exposed to outside air, and therefore, when reusing the recovered molten metal for metal filling, defective filling or the like due to alternation and deterioration of metal is not caused.

Further, it is preferred that the molten metal in the supply tank is stirred by appropriate stirring means. Because the recovered molten metal is mixed with the molten metal in the supply tank, stirring these molten metals can make the state of the molten metal in the supply tank uniform, and therefore it is possible to achieve a stable-quality metal filling. It is noted that, because oxides of the molten metal which cause defective filling or defective electrode performance float up, it is preferred that the molten metal is stirred so that the oxides are not mixed therein.

Further, for obtaining good fillingness, it is preferred that, when recovering the molten metal, it is recovered while maintaining the pressure (pressurizing pressure) applied to the molten metal in the processing chamber.

Thus, as described in detail above, according to the metal filling apparatus of the present invention, excess molten metal which has not been filled into the minute space can be recovered by the molten metal recovery mechanism, it is possible to reduce waste of a metal material used and it is possible to reduce material costs in metal filling.

Further, when recovering the molten metal, by bringing the pressing portion of the second body of the processor body or the pressing member into contact with the surface of the object to be processed by the pressing mechanism, the amount of excess molten metal on the object to be processed can be very small and material costs necessary for metal filling can be reduced to the utmost limit. Furthermore, it is possible to minimize labor of removing an unnecessary cured metal after cooling.

DETAILED DESCRIPTION

Hereinafter, preferred embodiments of the present invention will be described on the basis of the accompanying drawings. It is noted that, in these embodiments, the object to be processed is a semiconductor wafer and a metal is filled into a large number of minute holes (minute spaces) formed on a surface of the semiconductor wafer to have an opening in said surface.

Further, in these embodiments, the metal used for metal filling is a lead-free solder alloy (having a melting point of about 200° C.). The reason therefor is that, because metals having a relatively low melting point such as solder alloys are easy to handle and it is possible to keep the temperature of the semiconductor wafer at a relatively low temperature when embodying the present invention, such metals are advantageous in that they do not damage a wiring material and the like of the semiconductor wafer K. However, the kind of the metal in the present invention is not limited to solder alloys, and it is possible to employ an arbitrary metal, e.g., Au, Ag, Cu, Pt, Pd, Ir, Al, Ni, Sn, In, Bi, Zn and alloys including them, corresponding to the purpose of filling the minute spaces or the function of the minute spaces.

First Embodiment

First, a first embodiment of the present invention will be described on the basis of FIGS. 1 to 4.

1. Device Configuration

Figure 1:
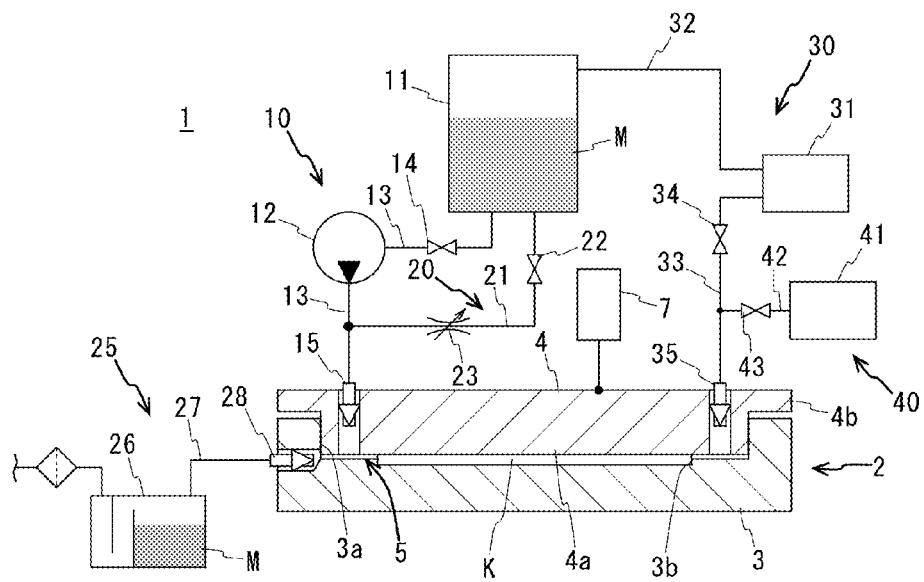
FIG. 1 is an illustration showing a configuration of a metal filling apparatus according to a first embodiment of the present invention.

Hereinafter, a device configuration of a metal filling apparatus of this embodiment will be described. As shown in FIG. 1, a metal filling apparatus 1 of this embodiment comprises a processor body 2, a presser 7, a molten metal supply mechanism 10, a molten metal recovery mechanism 20, a disposal mechanism 25, a pressure reducing mechanism 30, and a gas supply mechanism 40.

The processor body 2 comprises a first body 3 having a recess portion 3a open to the top surface thereof, and second body 4 having a pressing portion 4a which is airtightly fitted into the recess portion 3a and having a flange portion 4b of a diameter larger than that of the pressing portion 4a. A holding hole 3b is formed in the bottom of the recess portion 3a of the first body 3 and the semiconductor wafer K is contained and held in the holding hole 3b so that the surface thereof protrudes from the bottom of the recess portion 3a. The first body 3 and the second body 4 are assembled by fitting the pressing portion 4a into the recess portion 3a, and thereby an airtight processing chamber 5 is formed by the first body 3 and the second body 4 inside of them.

It is noted that the first body 3 and the second body 4 are heated to a temperature equal to or higher than the melting point of the lead-free solder alloy (200° C.) by a not-shown appropriate heater so that a molten metal M is not immediately cooled and cured when supplying the molten metal M into the processing chamber 5.

Figure 2:
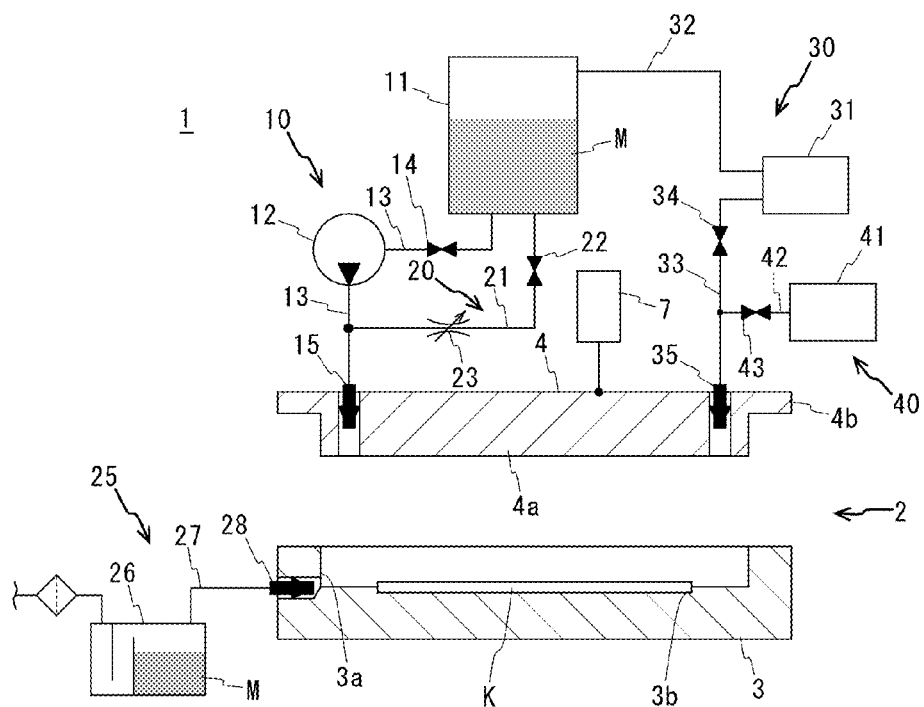
FIG. 2 is an illustration for explaining an operation of the metal filling apparatus according to the first embodiment.

The presser 7 comprises an actuator, e.g., an oil hydraulic cylinder, and moves the second body 4 to a pressing position at which the pressing portion 4a of the second body 4 is brought into contact with the surface of the semiconductor wafer K held in the recess portion 3a of the first body 3 (the position shown in FIG. 4), to a waiting position at which the pressing portion 4a is separated from the first body 3 (the position shown in FIG. 3), and to an initial position at which the second body 4 is spaced apart from the first body 3 (the position shown in FIG. 2). It is noted that, although in FIGS. 1 to 4 the presser 7 is shown in a state where it is connected to a position offset from the center of the second body, this is for convenience in drawing the figures and the presser 7 is preferably connected to the central position of the second body.

The molten metal supply mechanism 10 comprises a supply tank 11 in which the molten metal M is stored, a valve gate 15 provided on the second body 4 to communicate with the processing chamber 5, a supply pipe 13 one end of which is connected to the supply tank 11 and the other end of which is connected to the valve gate 15, a supply pump 12 interposed in the supply pipe 13, and an opening and closing valve 14 similarly interposed in the supply pipe 13. As for the supply pump 12, while any device may be used that is capable of pressurizing and discharging the molten metal M melted to a high temperature, in an exemplary embodiment a plunger pump may be used.

In the supply tank 11, a metal to be used for metal filling is heated to a temperature higher than its melting point and stored in a molten state, that is, in liquid form. The molten metal M in the supply tank 11 is supplied into the processing chamber 5 of the processor body 2 in a pressurized state by driving the supply pump 12 and opening the valve gate 15 and the opening and closing valve 14.

It is noted that at least the portions of the valve gate 15, the supply pipe 13, the opening and closing valve 14, and the supply pump 12 where the molten metal M flows are heated similarly to the supply tank 11, and thereby the molten metal M flowing through these portions is prevented from being cooled and cured.

The molten metal recovery mechanism 20 comprises a recovery pipe 21 one end of which is connected to the supply pipe 13 between the processor body 2 and the supply pump 12 and the other end of which is connected to the supply tank 11, and an opening and closing valve 22 and a throttle valve 23 which are interposed in the recovery pipe 21. It is noted that at least the portions of the recovery pipe 21, the opening and closing valve 22, and the throttle valve 23 where the molten metal M flows are heated similarly to the supply tank 11, and thereby the molten metal flowing through these portions is prevented from being cooled and cured.

The pressure reducing mechanism 30 comprises a pressure reducer 31 comprising a vacuum pump and other components, a valve gate 35 provided on the second body 4 to communicate with the processing chamber 5, a pressure reducing pipe 32 one end of which is connected to the supply tank 11 and the other end of which is connected to the pressure reducer 31, a pressure reducing pipe 33 one end of which is connected to the valve gate 35 and the other end of which is connected to the pressure reducer 31, and an opening and closing valve 34 interposed in the pressure reducing pipe 33.

According to the pressure reducing mechanism 30, the pressure inside the supply tank 11 is reduced to a vacuum state of, for example, about 100 Pa via the pressure reducing pipe 32 by driving the pressure reducer 31, and further the pressure inside the processing chamber 5 of the processor body 2 is reduced to, for example, the above-mentioned vacuum state via the pressure reducing pipe 33 by closing a later-described opening and closing valve 43 and opening the opening and closing valve 34 and the valve gate 35 in a state where the pressure reducer 31 is driven. Bringing the inside of the supply tank 11 into a vacuum state is preferable in view of preventing deterioration of the molten metal M and eliminating bubbles from the molten metal M. It is noted that the above-mentioned pressure value is merely an example and a higher vacuum state may be used.

The gas supply mechanism 40 comprises a gas supplier 41 pressurizing and supplying an inert gas, e.g., $N_2$ gas, a gas supply pipe 42 one end of which is connected to the pressure reducing pipe 33 between the valve gate 35 and the opening and closing valve 34 and the other end of which is connected to the gas supplier 41, and an opening and closing valve 43 interposed in the gas supply pipe 42.

According to the gas supply mechanism 40, a pressurized gas is supplied into the processing chamber 5 of the processor body 2 from the gas supplier 41 through the gas supply pipe 42 and the pressure reducing pipe 33 connected to the gas supply pipe 42 by closing the opening and closing valve 34 and opening the opening and closing valve 43 and the valve gate 35.

Further, the disposal mechanism 25 comprises a disposal tank 26 in which a waste molten metal M is stored, a valve gate 28 provided on the first body 3 to communicate with the bottom of the recess portion 3a of the first body 3, and a disposal pipe 27 one end of which is connected to the valve gate 28 and the other end of which is connected to the disposal tank 26.

2. Metal Filling Operation

Next, an operation procedure of metal filling by the metal filling apparatus 1 having the above-described configuration will be described using FIGS. 2 to 4.

First, as shown in FIG. 2, the presser 7 is driven and thereby the second body 4 is moved to the initial position and thereby the first body 3 and the second body 4 are spaced apart from each other, and a semiconductor wafer K is contained and held in the holding hole 3b of the first body 3.

At this time, the valve gates 15, 28, 35 are closed and the opening and closing valves 14, 22, 34, 43 are also closed.

Thereafter, the second body 4 is moved to the waiting position by the presser 7 and thereby the pressing portion 4a of the second body 4 is fitted into the recess portion 3a of the first body 3. Thereby, as shown in FIG. 3, the airtight processing chamber 5 is formed by the recess portion 3a of the first body 3 and the pressing portion 4a of the second body 4.

Subsequently, the opening and closing valve 34 and the valve gate 35 are opened and the air inside the processing chamber 5a is exhausted through the pressure reducing pipe 33, thereby bringing the inside of the processing chamber 5 into a vacuum state similarly to the supply tank 11.

Figure 3:
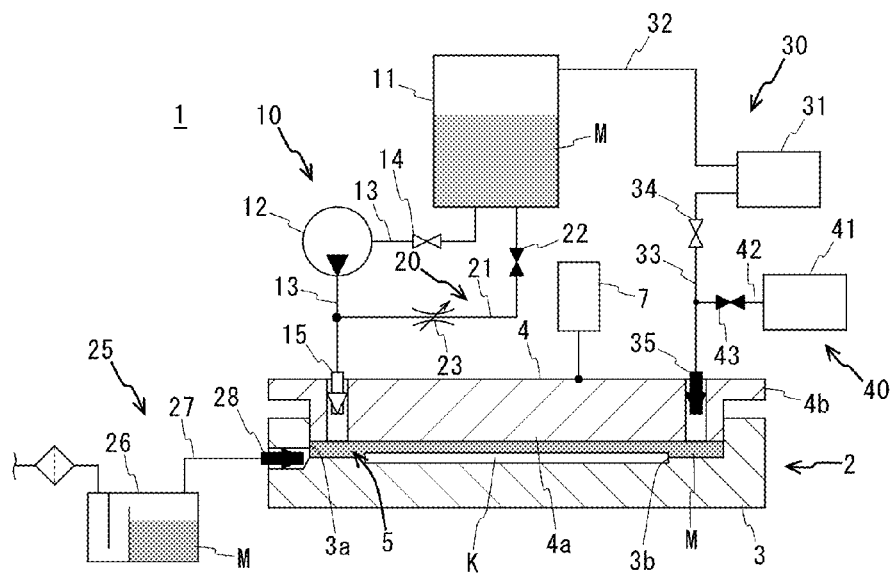
FIG. 3 is an illustration for explaining the operation of the metal filling apparatus according to the first embodiment.

Subsequently, as shown in FIG. 3, the opening and closing valve 34 of the pressure reducing pipe 33 and the valve gate 35 are closed, and while maintaining the processing chamber 5 at the vacuum state, the supply pump 12 is driven and the opening and closing valve 14 and the valve gate 15 are opened, and the molten metal M in the supply tank 11 is pressurized and supplied into the processing chamber 5 so that it covers the entire surface of the semiconductor wafer K and so that the whole space inside the processing chamber 5 is filled with the molten metal M.

As described above, the inside of the processing chamber 5 is brought into a vacuum state by the pressure reducer 31 and therefore the insides of the minute spaces of the semiconductor wafer K held in the processing chamber 5 are also in a vacuum state. Therefore, by supplying the molten metal M so that it covers the entire surface of the semiconductor wafer K, the molten metal M is filled into the minute spaces, and further, by supplying the molten metal M so that the whole space inside the processing chamber 5 is filled with the molten metal M, the source pressure of the supply pump 12 is transmitted to the molten metal M in the processing chamber 5 and the molten metal M in the processing chamber 5 is pressurized, and thereby the molten metal M in the processing chamber 5 is filled into the minute spaces by a stronger force. Thereby, it is possible to fill the metal into the minute spaces in a good state with no clearance and no void.

Figure 4:
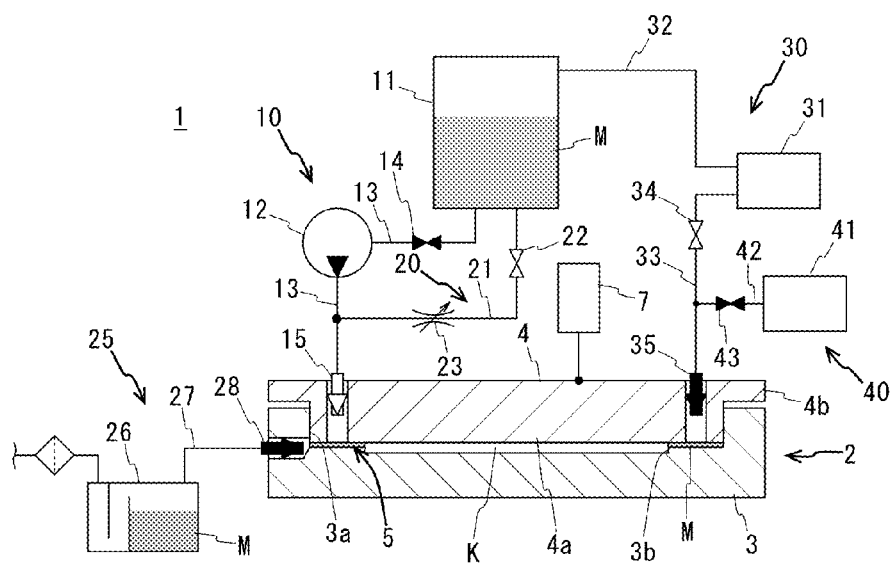
FIG. 4 is an illustration for explaining the operation of the metal filling apparatus according to the first embodiment.

Subsequently, as shown in FIG. 4, after closing the opening and closing valve 14 of the supply pipe 13, the opening and closing valve 22 of the recovery pipe 21 is opened, and thereafter, the second body 4 is further move downward by the presser 7 and thereby the pressing portion 4a of the second body 4 is brought into contact with the surface of the semiconductor wafer K. Thereby, the capacity of the processing chamber 5 is reduced, and accordingly excess molten metal M in the processing chamber 5 is pressed out through the valve gate 15 and flows back, and is recovered into the supply tank 11 through the recovery pipe 21 branching from the supply pipe 13 between the valve gate 15 and the supply pump 12.

At this time, since the throttle valve 23 is provided in the recovery pipe 21, the pressure of the molten metal M in the processing chamber 5 is maintained at a predetermined pressure. It is noted that the pressure of the molten metal M to be maintained by the throttle valve 23 is a pressure which does not cause a clearance and a void in the metal filled into the minute spaces and which is set experimentally, and the throttle valve 23 is adjusted to have a degree of openness which allows the pressure of the molten metal M in the processing chamber 5 to be maintained at the predetermined pressure. It is noted that it is more preferred that the supply pump 12 is being driven during the recovery operation because this makes it possible to more surely maintain the pressure of the molten metal M in the processing chamber 5.

Further, since the pressing portion 4a of the second body 4 is brought into contact with the surface of the semiconductor wafer K, it is possible to remove excess molten metal M on the semiconductor wafer K therefrom and thereby make the amount of the excess molten metal M very small.

Thus, the function of the presser 7 directly involves the recovery of the molten metal M, and the recovery of the molten metal M is achieved by cooperation between the presser 7 and the molten metal recovery mechanism 20. Therefore, the presser 7 serves a part of the molten metal recovery function in the present invention.

It is noted that, because it is desirable to improve the adhesion between the second body 4 and the semiconductor wafer K when moving the second body 4 downward and thereby pressing out excess molten metal M on the semiconductor wafer K, it is preferred that a surface treatment is performed on a region to be brought into contact with the surface of the semiconductor wafer K of the second body 4 using Teflon® (polytetrafluoroethylene), which is excellent in elasticity and heat resistance, or the like.

After recovering excess molten metal M in the processing chamber 5 in the above-described manner, the opening and closing valve 22 of the recovery pipe 21 and the valve gate 15 are closed, and thereafter, the opening and closing valve 43 of the gas supply pipe 42 and the valve gate 35 are opened and an inert gas is supplied into the processing chamber 5 from the gas supplier 41, and the valve gate 28 of the disposal pipe 27 is opened and the inert gas supplied into the processing chamber 5 is exhausted into the disposal tank 26. Thereby, the inside of the processing chamber 5 is scavenged by the inert gas, and a small amount of the molten metal M remaining in the processing chamber 5, that is, the molten metal M which has not been recovered by the movement of the second body 4 is recovered into the disposal tank 26 through the valve gate 28 and the disposal pipe 27 by the gas flow of the inert gas.

It is noted that, in this case, it is preferred that a sealing member, for example, an O-ring, is provided at the outer periphery of the lower surface of the pressing portion 4a of the second body 4 and the region where the minute spaces formed on the surface of the semiconductor wafer K exist is surrounded and sealed by the sealing member when the lower surface of the pressing portion 4a is brought into contact with the surface of the semiconductor wafer K. In this configuration, the region surrounded by the sealing member can be airtightly sealed from the outside region where the inert gas exists, and it is possible to prevent replacement of the molten metal M in the minute spaces with the inert gas due to the scavenging.

As described above, although most of the excess molten metal M is recovered by moving the second body 4 so that it is brought into contact with the semiconductor wafer K, as shown in FIG. 4, the molten metal still remains in a space formed due to the difference in level between the bottom surface of the processing chamber 5 and the top surface of the semiconductor wafer K. Such molten metal M can be altered due to a long stay in the processing chamber, and if the molten metal M altered stays there, there is the fear that it is mixed with the molten metal M supplied when processing the next semiconductor wafer K and defective metal filling results.

Therefore, recovering the molten metal M which cannot be reused into the disposal tank 26 by the above-described disposal processing makes it possible to bring the inside of the processing chamber 5 after filling processing into a clean state with no excess molten metal M, and it is therefore possible to continue performing a high-quality metal filling even when the filling processing is successively performed on a plurality of semiconductor wafers K.

When the disposal processing has been finished, the valve gate 28, the opening and closing valve 43 and the valve gate 35 are closed and the heating of the first body 3 and the second body 4 is stopped, and they are cooled to a temperature equal to or lower than the melting point of the molten metal M and the molten metal M filled into the minute space is cured. Thereafter, the second body 4 is moved upward to the initial position by the presser 7, and, as shown in FIG. 2, the first body 3 and the second body 4 are spaced apart from each other, and then the semiconductor wafer K is detached from the first body 3 and the metal filling processing for one semiconductor wafer K is finished. In a case where the filling processing is successively performed on a plurality of semiconductor wafers K, the above-described processing is repeatedly performed.

3. Summary

As described in detail above, according to the metal filling apparatus 1 of this embodiment, since excess molten metal M on the semiconductor wafer K is recovered from the semiconductor wafer K to the supply tank 11 by the functions of the presser 7 and the molten metal recovery mechanism 20 and reused, it is possible to reduce waste of a metal material used and it is possible to reduce material costs in metal filling.

Further, since the pressing portion 4a of the second body 4 is brought into contact with the surface of the semiconductor wafer K at the time of recovering the molten metal M, the amount of excess metal which has not been filled into the minute space and remains on the semiconductor wafer K can be made very small, and material costs necessary for metal filling can be reduced to the utmost limit. Further, it is possible to minimize labor of removing an unnecessary cured metal from the semiconductor wafer K after cooling.

Furthermore, since the throttle valve 23 is provided in the recovery pipe 21, the vacuum pressure inside the supply tank 11 does not act on the inside of the processing chamber 5 even when, at the time of recovering the molten metal M, the opening and closing valve 22 is opened and thereby the supply tank 11 and the processing chamber 5 are brought into a communicating state, and therefore it is possible to maintain the inside of the processing chamber 5 at the pressurized state and thereby maintain good fillingness.

It is noted that it is preferred that the path of recovering the molten metal M into the supply tank 11 is configured not to be exposed to outside air for preventing deterioration (especially, oxidation) of the molten metal M.

Further, it is preferred that the molten metal M in the supply tank 11 is stirred by an appropriate stirrer (a stirring propeller or the like). Although the recovered molten metal M is mixed with the molten metal M in the supply tank 11, the state of the molten metal M in the supply tank 11 can be made uniform by stirring it, and thereby a stable-quality metal filling can be achieved. It is noted that, because oxides of the molten metal which cause defective filling or defective electrode performance float up, it is preferred that the molten metal is stirred so that the oxides are not mixed therein.

Further, although the molten metal M stays in the supply pipe 13 and the recovery pipe 21 at the time of waiting for the metal filling processing, in this case, the molten metal M may be circulated in the order of the supply tank 11, the supply pipe 13, the supply pump 12, the recovery pipe 21 and the supply tank 11 by controlling the opening and closing valves 14, 22 as appropriate and driving the supply pump 12. Circulating the heated molten metal M through these members prevents alternation of the molten metal M caused by stagnation of the molten metal M in parts of these members.

Further, the supply pipe 13 and the recovery pipe 21 are preferably as short as possible. The reason therefor is that, although, as described above, it is necessary to heat the supply pipe 13 and the recovery pipe 21 to a temperature equal to or higher than the melting point of the molten metal M so that the molten metal M is not cooled and cured, an extra heater and electric power therefor become necessary as the lengths of the pipes become longer. Further, when the pipe length is long, there is the fear that the molten metal M is solidified or altered in parts of the piping due to a temperature difference, whereas, when the pipe length is short, it is easy to make the temperature in the piping uniform throughout the piping.

Next, variations of the metal filling apparatus 1 will be described.

Variation 1 in First Embodiment

Figure 5:
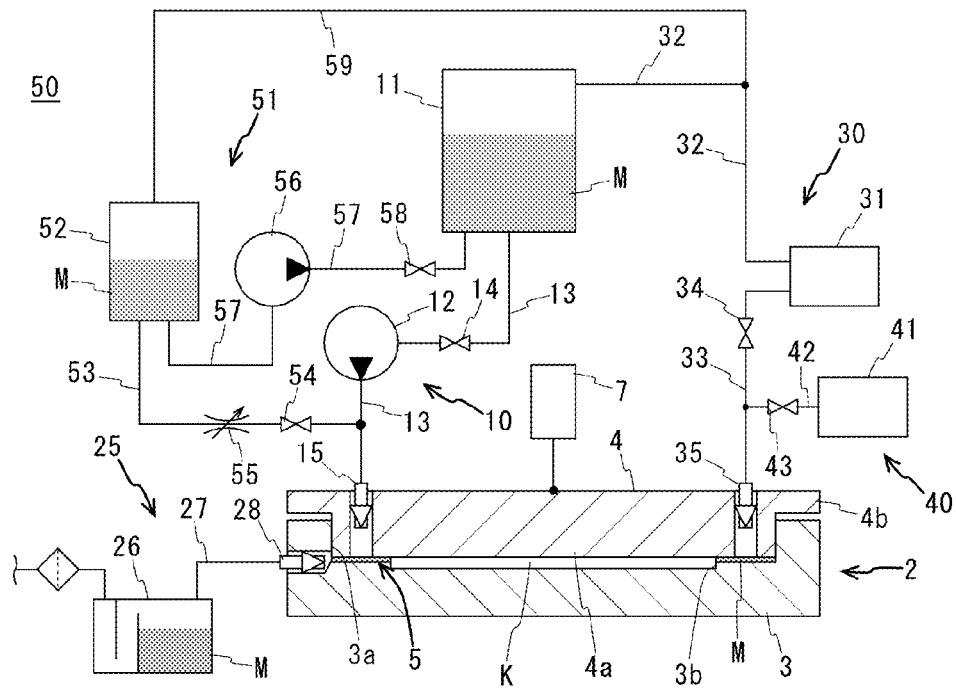
FIG. 5 is an illustration showing a configuration of a metal filling apparatus according to Variation 1 of the first embodiment.

FIG. 5 is an illustration showing a configuration of a metal filling apparatus 50 according to this variation. It is noted that the metal filling apparatus 50 has, instead of the molten metal recovery mechanism 20 of the above-described metal filling apparatus 1, a molten metal recovery mechanism 51 having a configuration different from that of the molten metal recovery mechanism 20. Therefore, the same components as those of the above-described metal filling apparatus 1 are indicated by the same references and detailed explanations thereof are omitted. Further, because the metal filling operation and the molten metal disposal operation are the same as in the metal filling apparatus 1, detailed explanations thereof are omitted and the molten metal recovery operation will be mainly described.

As shown in FIG. 5, the molten metal recovery mechanism 51 comprises a recovery tank 52 in which the recovered molten metal M is stored, a recovery pipe 53 one end of which is connected to the supply pipe 13 between the processor body 2 and the supply pump 12 and the other end of which is connected to the recovery tank 52, an opening and closing valve 54 and a throttle valve 55 which are interposed in the recovery pipe 53, a return pipe 57 one end of which is connected to recovery tank 52 and the other end of which is connected to the supply tank 11, a return pump 56 interposed in the return pipe 57, an opening and closing valve 58 interposed in the return pipe 57 between the return pump 56 and the supply tank 11, and a pressure reducing pipe 59 one end of which is connected to the recovery tank 52 and the other end of which is connected to the pressure reducing pipe 32.

It is noted that the recovery tank 52 is heated to a temperature equal to or higher than the melting point of the molten metal M so that the molten state of the molten metal M is maintained, and at least portions where the molten metal M flows of the recovery pipe 53, the opening and closing valve 54, the throttle valve 55, the return pump 56, the return pipe 57 and the opening and closing valve 58 are similarly heated, thereby preventing the molten metal M from being cooled and cured.

According to the metal filling apparatus 50, the molten metal M is filled into the minute spaces of the semiconductor wafer K by performing the same operation as in the metal filling apparatus 1 in a state where the opening and closing valve 54 is closed. Then, when, in a state where the opening and closing valve 14 is closed and the opening and closing valve 54 is opened, the second body 4 is moved from the waiting position to the pressing position by the presser 7 and thereby the pressing portion 4a of the second body 4 is brought into contact with the surface of the semiconductor wafer K, the capacity of the processing chamber 5 is reduced, and accordingly excess molten metal M in the processing chamber 5 is pressed out through the valve gate 15 and flows back, and is recovered into the recovery tank 52 through the recovery pipe 53 branching from the supply pipe 13 between the valve gate 15 and the supply pump 12. At this time, since the throttle valve 55 is provided in the recovery pipe 53, the pressure of the molten metal M in the processing chamber 5 is maintained at a predetermined pressure.

When a predetermined amount of the molten metal M has been recovered into the recovery tank 52 in this manner, the return pump 56 is driven in a state where the opening and closing valve 58 is opened, and the molten metal M in the recovery tank 52 is returned to the supply tank 11 through the return pipe 57.

Thus, also according to the metal filling apparatus 50, the same effect as that of the above-described metal filling apparatus 1 is achieved.

It is noted that, in the metal filling apparatus 50, the return mechanism section comprising the return pump 56, the return pipe 57 and the opening and closing valve 58 is not always necessary, and the molten metal M in the recovery tank 52 may be manually returned to the supply tank 11 at the time when an appropriate amount of the molten metal M has been recovered into the recovery tank 52.

Variation 2 in First Embodiment

Figure 6:
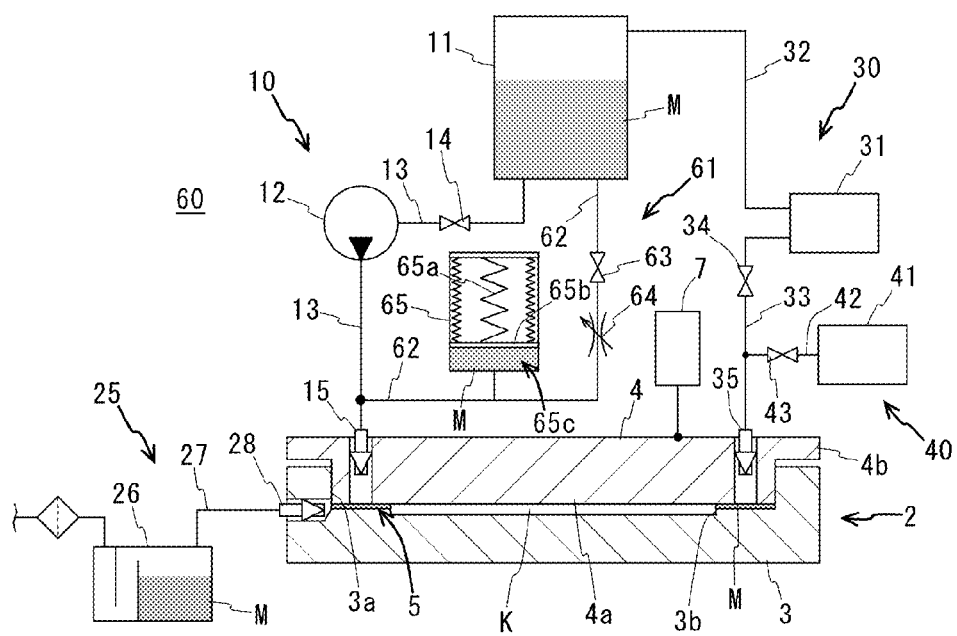
FIG. 6 is an illustration showing a configuration of a metal filling apparatus according to Variation 2 of the first embodiment.

FIG. 6 is an illustration showing a configuration of a metal filling apparatus 60 according to this variation. It is noted that the metal filling apparatus 60 has, instead of the molten metal recovery mechanism 20 of the above-described metal filling apparatus 1, a molten metal recovery mechanism 61 having a configuration different from that of the molten metal recovery mechanism 20. Therefore, the same components as those of the above-described metal filling apparatus 1 are indicated by the same references and detailed explanations thereof are omitted. Further, because the metal filling operation and the molten metal disposal operation are the same as in the metal filling apparatus 1, detailed explanations thereof are omitted and the molten metal recovery operation will be mainly described.

As shown in FIG. 6, the molten metal recovery mechanism 61 comprises a recovery pipe 62 one end of which is connected to the supply pipe 13 between the processor body 2 and the supply pump 12 and the other end of which is connected to the supply tank 11, an opening and closing valve 63 and a throttle valve 64 which are interposed in the recovery pipe 62, and a buffer tank 65 connected to the recovery pipe 62.

The buffer tank 65 has a spring 65a and a movable plate 65b which is biased toward the recovery pipe 62 by the spring 65a therein, and is configured to have a containing space 65c formed between the connection with the recovery pipe 62 and the movable plate 65b. Further, the spring 65a presses the molten metal M contained in the containing space 65c via the movable plate 65b with a biasing force corresponding to its spring constant.

It is noted that, also in the metal filling apparatus 60, at least portions where the molten metal M flows of the recovery pipe 62, the opening and closing valve 63 and the throttle valve 64 and the buffer tank 65 are heated to a temperature equal to or higher than the melting point of the molten metal M so that the molten state of the molten metal M is maintained.

According to the metal filling apparatus 60, the molten metal M is filled into the minute spaces of the semiconductor wafer K by performing the same operation as in the metal filling apparatus 1 in a state where the opening and closing valve 63 is closed. It is noted that the spring constant of the spring 65a is set so that the pressure acting on the molten metal in the containing space 65c due to the biasing force of the spring 65a is higher than the discharge pressure (source pressure) of the supply pump 12, and therefore the molten metal M discharged from the supply pump 12 does not flow into the buffer tank 65 at the time of the metal filling operation.

Subsequently, in a state where the opening and closing valve 14 and the opening and closing valve 63 are closed, the second body 4 is moved from the waiting position to the pressing position by the presser 7 and thereby the pressing portion 4a of the second body 4 is brought into contact with the surface of the semiconductor wafer K. Thereby, the capacity of the processing chamber 5 is reduced, and accordingly excess molten metal M in the processing chamber 5 is pressed out through the valve gate 15 and flows back, and is temporally recovered into the containing space 65c of the buffer tank 65 through the recovery pipe 62 branching from the supply pipe 13 between the valve gate 15 and the supply pump 12. It is noted that, naturally, the presser 7 presses the molten metal M in the processing chamber 5 so that a pressure higher than the pressure acting on the molten metal M in the containing space 65c due to the spring 65a is generated.

After recovering the molten metal M in the processing chamber 5 into the containing space 65c of the buffer tank 65 in this manner, when the opening and closing valve 63 is opened in a state where the valve gate 15 is closed, the molten metal M recovered into the buffer tank 65 is pressed out into the recovery pipe 62 by the biasing force of the spring 65a and is recovered into the supply tank 11 through the recovery pipe 62. It is noted that the throttle valve 64 provided in the recovery pipe 62 plays a role of controlling the flow rate of the molten metal flowing from the buffer tank 65 to the supply tank 11, and also has a role of preventing the inside of the supply tank 11 from being disturbed by a rapid flow of the molten metal into the supply tank 11.

Thus, also according to the metal filling apparatus 50, the same effect as that of the above-described metal filling apparatus 1 is achieved.

It is noted that the spring 65a of the buffer tank 65 is not limited to the above-described one, and may have any configuration as long as it functions as a push-back device capable of applying the above-described necessary biasing force to the molten metal in the containing space 65c, for example, may have a configuration in which a gas pressure is caused to act on the back surface of the movable plate 65b or a configuration in which an acting force is applied to the back surface of the movable plate 65b by an appropriate actuator.

Variation 3 in First Embodiment

Figure 7:
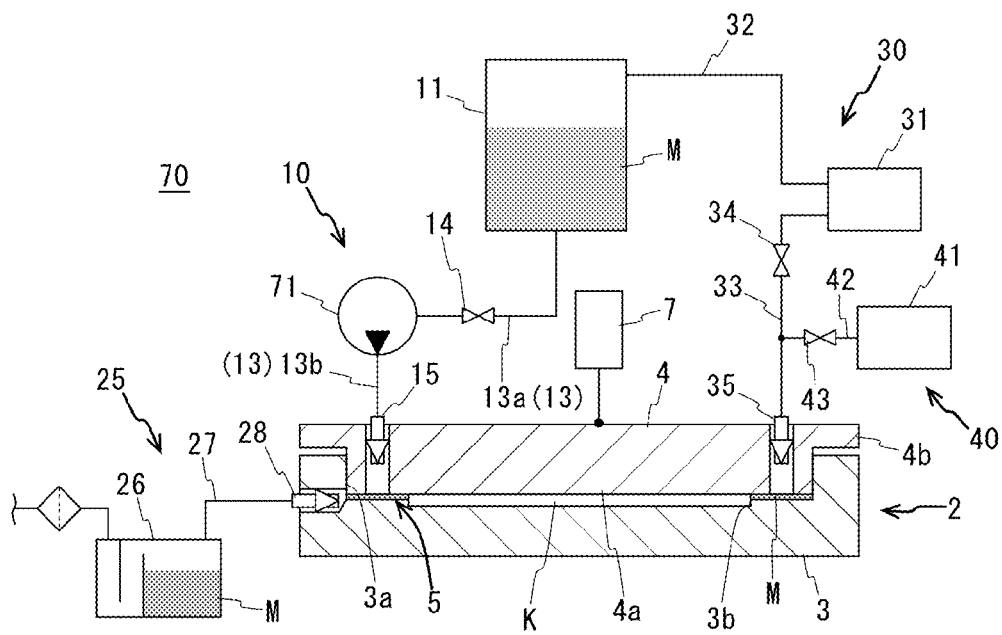
FIG. 7 is an illustration showing a configuration of a metal filling apparatus according to Variation 3 of the first embodiment.
Figure 8:
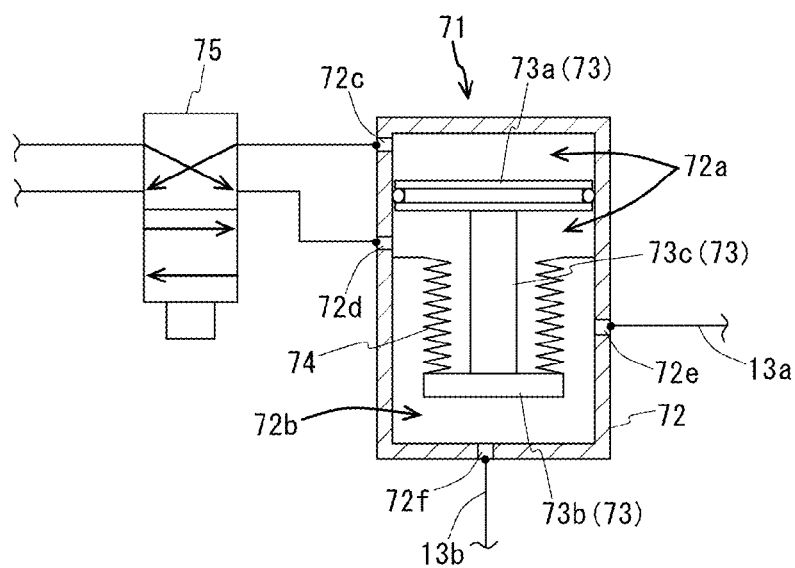
FIG. 8 is a sectional view of a supply pump of the metal filling apparatus shown in FIG. 7.

FIG. 7 is an illustration showing a configuration of a metal filling apparatus 70 according to this variation. It is noted that the metal filling apparatus 70 has a configuration in which the molten metal recovery mechanism 20 is removed from the configuration of the above-described metal filling apparatus 1, and a plunger pump 71 as shown in FIG. 8 is used as a supply pump and the plunger pump 71 has a function of a metal recovery mechanism. Therefore, the same components as those of the above-described metal filling apparatus 1 are indicated by the same references and detailed explanations thereof are omitted. Further, because the metal filling operation and the molten metal disposal operation are the same as in the metal filling apparatus 1, detailed explanations thereof are omitted and the molten metal recovery operation will be mainly described.

As shown in FIG. 8, the plunger pump 71 of the metal filling apparatus 70 of this variation comprises a body 72 having a cylindrical inner space one side of which is a cylinder room 72a and the other side of which is a pressurization room 72b, a plunger arranged within the inner space of the body 72, and a bellows 74 liquid-tightly dividing the cylinder room 72a and the pressurization room 72b.

The plunger 73 comprises a piston portion 73a fitted in the cylinder room 72a, a pressurizing portion 73b positioned in the pressurization room 72b and formed to have a diameter smaller than that of the piston portion 73a, and a connecting portion 73b connecting the piston portion 73a and the pressurizing portion 73b. Further, the bellows 74 has one end fixed on the inner wall of the body 72 at the border between the cylinder room 72a and the pressurization room 72b and the other end fixed on the pressurizing portion 73b, and, as described above, liquid-tightly divides the cylinder room 72a and the pressurization room 72b.

Further, the body 72 has a pressurization side port 72c leading to the upper (pressurization side) region and of the regions on both sides of the piston portion 73a in the cylinder room 72 in FIG. 8, and a return side port 72d leading to the lower (return side) region thereof, and a switching valve 75 switches between the pressurization side port 72c and the return side port 72d and pressure oil is supplied from an appropriate pressure-oil supply source thereinto.

Further, the body 72 has an intake port 72e and a discharge port 72f which lead to the pressurization room 72b formed thereon, and a supply pipe 13a leading to the supply tank 11 is connected to the intake port 72e and a supply pipe 13b leading to the valve gate 15 is connected to the discharge port 72f.

According to the metal filling apparatus 70, the molten metal M is filled into the minute spaces of the semiconductor wafer K by performing the same operation as in the metal filling apparatus 1.

At this time, the plunger pump 71 supplies the molten metal M in the supply tank 11 into the processing chamber 5 of the processor body 1 by the following operation.

That is, in the plunger pump 71, first, pressure oil is supplied into the return side of the cylinder room 72a through the return side port 72d in a state where the opening and closing valve 14 is opened, and thereby the plunger 73 is moved upward, and thereby the capacity of the pressurization room 72b is increased and the molten metal M in the supply tank 11 is inhaled into the pressurization room 72b from the intake port 72e through the supply pipe 13. Thereafter, pressure oil is supplied into the pressurization side of the cylinder room 72 through the pressurization side port 72c in a state where the opening and closing valve 14 is closed, and thereby the plunger 73 is moved downward, and thereby the capacity of the pressurization room 72b is reduced and the molten metal M in the pressurization room 72b pressurized and the pressurized molten metal M is discharged from the discharge port 72f and is supplied into the processing chamber 5 through the supply pipe 13 and the valve gate 15.

After the molten metal M is filled into the minute spaces of the semiconductor wafer K, in a state where the opening and closing valve 14 is closed, the second body 4 is moved from the waiting position to the pressing position by the presser 7 and thereby the pressing portion 4a of the second body 4 is brought into contact with the surface of the semiconductor wafer K. Thereby, the capacity of the processing chamber 5 is reduced, and accordingly excess molten metal M in the processing chamber 5 is pressed out through the valve gate 15 and flows back, and flows into the pressurization room 72b of the plunger pump 71 through the supply pipe 13. It is noted that the presser 7 is configured to press the molten metal M in the processing chamber 5 so that a pressure higher than the discharge pressure of the plunger pump 71 is generated, and thereby the plunger 73 is moved upward and the pressure oil in the pressurization side of the cylinder room 72a is pressed back to the upstream side from the pressurization side port 72c, and accordingly the capacity of the pressurization room 72b is increased, and, as described above, the molten metal M in the processing chamber 5 flows back and flows into the pressurization room 72b of the plunger pump 71.

After temporally recovering excess molten metal M in the processing chamber 5 into the pressurization room 72b of the plunger pump 71 in this manner, when the opening and closing valve 14 is opened in a state where the valve gate 15 is closed, the plunger 73 of the plunger pump 71 is moved downward by the pressure oil acting on the pressurization side of the cylinder room 72a, and thereby the molten metal M in the pressurization room 72b is pressed out into the supply pipe 13 and the molten metal M pressed out is recovered into the supply tank 11 through the supply pipe 13.

Thus, when a component which is configured to be capable of accepting the molten metal flowing back, like the plunger pump 71, is used as a supply pump, it is possible to cause the plunger pump 71 to have a function as the molten metal recovery mechanism, and it is not necessary to provide such a special mechanism as the above-described ones. Therefore, it is possible to simplify the device configuration and it is also possible to minimize the region to be heated by a heater for preventing the molten metal M from being cooled and cured, and therefore reduction of apparatus costs can be achieved.

Second Embodiment

Next, a second embodiment of the present invention will be described on the basis of FIG. 9.

1. Device Configuration

First, a device configuration of a metal filling apparatus according to the second embodiment will be described. As shown in FIG. 9, a metal filling apparatus 100 of this embodiment comprises a processor body 110, a presser 7, a molten metal supply mechanism 10, a molten metal recovery mechanism 20, a disposal mechanism 25, a pressure reducing mechanism 30 and a gas supply mechanism 40. It is noted that, as for the presser 7, the molten metal supply mechanism 10, the molten metal recovery mechanism 20, the disposal mechanism 25, the pressure reducing mechanism 30 and the gas supply mechanism 40, although their connections with the processor body 110 are different from those in the above-described metal filling apparatus 1, other configurations are the same as those in the metal filling apparatus 1, and therefore they are indicated by the same references and detail explanations thereof are omitted.

The processor body 100 comprises a holding member 111 holding the semiconductor wafer K, a cylindrical member 112 having an inner space and having one end facing the holding member 111, and a pressing member 113 airtightly inserted in the inner space of the cylindrical member 112 to be movable forward and backward. It is noted that the processor body 100 is heated to a temperature equal to or higher than the melting point of the molten metal M by an appropriate heater.

The holding member 111 is configured to be moved upward and downward by a not-shown lifting mechanism, and when it is move downward by the lifting mechanism (not shown), the holding member 111 and the cylindrical member 112 are separated from each other and the semiconductor wafer K can be placed on the holding member 111, and when ti is moved upward by the lifting mechanism (not shown), the upper surface of the holding member 111 is brought into contact with the lower surface of the cylindrical member 112 and they are airtightly assembled.

Further, the cylindrical member 112 has a containing recess portion 112a formed in the lower surface thereof for containing the semiconductor wafer K held by the holding member 111, the holding member 111 and the cylindrical member 112 are assembled in a state where the semiconductor wafer K is held on the holding member 111 and is contained in the containing recess portion 112a of the cylindrical member 112. Thus, when the holding member 111 and the cylindrical member 112 are assembled in this manner, an airtight processing chamber 114 is formed by the semiconductor wafer K, the cylindrical member 112 and the pressing member 113.

It is noted that although this configuration is preferable because the semiconductor wafer K is pressed down by the cylindrical member 112, and therefore, at the time of supplying the molten metal M into the processing chamber 114, the semiconductor wafer K is prevented from floating up and the molten metal M is prevented from entering under the semiconductor wafer K, the configuration is not limited thereto and the cylindrical member 112 may have an inner diameter larger than the outer diameter of the semiconductor wafer K so that the semiconductor wafer K is contained within the inner space of the cylindrical member 112. In this case, the airtight processing chamber 114 is formed by the holding member 111, the cylindrical member 112 and the pressing member 113.

Further, the cylindrical member 112 has a large inner diameter portion forming the processing chamber 114 and a small inner diameter portion smaller than the large inner diameter portion, and the pressing member 113 is airtightly inserted in the small inner diameter portion and a gap is formed between the outer peripheral surface of the pressing member 113 and the inner peripheral surface of the large inner diameter portion.

Further, on the cylindrical member 112, the valve gate 15 of the molten metal supply mechanism 10 and the valve gate 28 of the disposal mechanism 25 are disposed at a position as close as possible to the containing recess portion 112a to lead to the inside of the processing chamber 114, and the valve gate 35 of the pressure reducing mechanism 30 is disposed at an upper position of the large inner diameter portion to lead to the inside of the processing chamber 114.

Furthermore, the presser 7 moves the pressing member 113 between a pressing position at which the lower surface of the pressing member 113 is brought into contact with the surface of the semiconductor wafer K held by the holding member 111 and a waiting position at which the lower surface of the pressing member 113 is spaced from the surface of the semiconductor wafer K with a predetermined distance. It is noted that, in FIG. 9, although the presser 7 is shown in a state where it is connected to a position offset from the center of the pressing member 113, this is for convenience in drawing the figure and the presser 7 is preferably connected to the central position of the pressing member 113.

2. Metal Filling Operation

Next, an operation procedure of metal filling by the metal filling apparatus 100 having the above-described configuration will be described. It is noted that, here, procedure of operations of filling a metal and recovering excess molten metal are mainly described, and additional elements such as a preferred mode are the same as those in the above-described metal filling apparatus 1, and therefore detailed explanations thereof are omitted.

Figure 9:
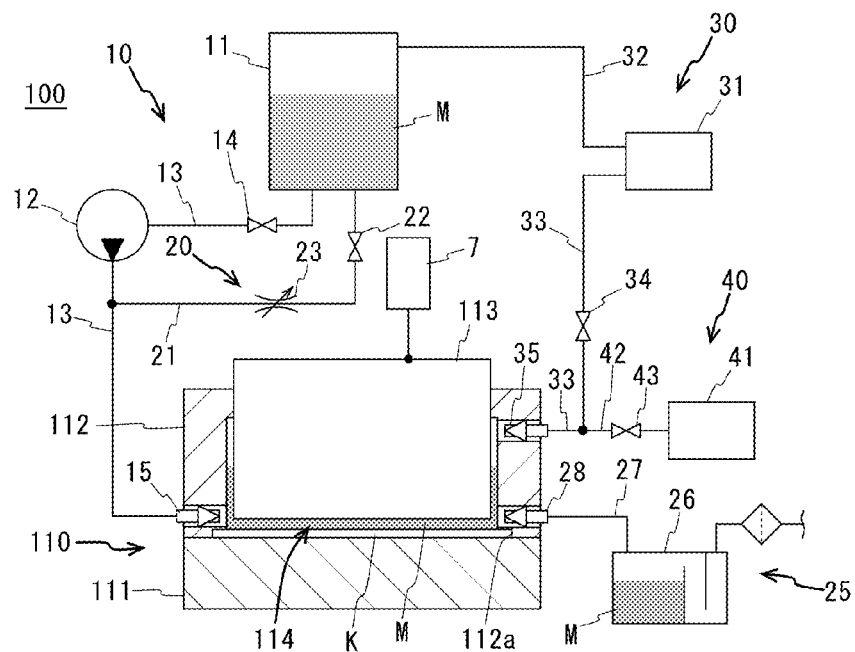
FIG. 9 is an illustration showing a configuration of a metal filling apparatus according to a second embodiment of the present invention.

First, as shown in FIG. 9, the holding member 111 and the cylindrical member 112 are assembled in a state where the semiconductor wafer K is held on the holding member 111. It is noted that, at this time, the presser 7 positions the pressing member 113 at the waiting position.

Further, the inside of the supply tank 11 has been brought in a vacuum state by the pressure reducer 31, the valve gates 15, 28, 35 are closed and the opening and closing valves 14, 22, 34, 43 are also closed.

Thereafter, the opening and closing valve 34 and the valve gate 35 are opened and the air inside the processing chamber 114 is exhausted through the pressure reducing pipe 33, thereby bringing the inside the processing chamber 114 into a vacuum state similarly to the supply tank 11.

Subsequently, while the inside of the processing chamber 114 is maintained at the vacuum state, the supply pump 12 is driven and the opening and closing valve 14 and the valve gate 15 are opened, and the molten metal M in the supply tank 11 is pressurized and supplied into the processing chamber 114 so that it covers the entire surface of the semiconductor wafer K and so that at least a lower end portion of the pressing member 113 is immersed in the molten metal M. Thereby, the molten metal M is filled into the minute spaces of the semiconductor wafer K, which have been brought into the vacuum state by the pressure reducer 31.

It is noted that, as have been described, in order to perform sufficient metal filling by reducing the effect of the surface tension of the molten metal M and compensating poor wettability of the semiconductor wafer K, it is desirable to cover the semiconductor wafer K with a certain large amount of the molten metal M. For example, when the molten metal M is supplied to have a thickness of 10 mm, all regions on the semiconductor wafer K are covered by a sufficient amount of the molten metal M and therefore the metal can be stably filled into the minute spaces. Therefore, the waiting position of the pressing member 113 which is positioned by the presser 7 is set so that the distance between the lower surface of the pressing member 113 and the top surface of the semiconductor wafer K is equal to or larger than the thickness of the molten metal M to be formed on the semiconductor wafer K.

Subsequently, in a state where the opening and closing valve 34 is closed and the opening and closing valve 14 and the valve gate 15 are closed, the opening and closing valve 43 is opened and a pressurized inert gas is supplied into the processing chamber 114 from the gas supplier 41 through the gas supply pipe 42, thereby pressurizing the inside of the processing chamber 114. Thereby, the molten metal M in the processing chamber 114 is pressurized and the molten metal M is filled into the minute spaces by the gas pressure, and therefore the molten metal M is filled in a good state with no clearance and no void. It is noted that, since the molten metal M is supplied so that the lower end portion of the pressing member 113 is immersed in the molten metal M, when supplying an inert gas into the processing chamber 114 and thereby pressurizing the molten metal M, the inert gas does not enter between the lower surface of the pressing member 113 and the surface of the semiconductor wafer K, and therefore a disadvantage that the molten metal M which has been filled into the minute spaces is replaced by the inert gas does not occur.

Then, the pressing member 113 is moved downward to the pressing position by the presser 7 and the lower surface thereof is brought into contact with the surface of the semiconductor wafer K. Thereby, excess molten metal M on the semiconductor wafer K is pressed out therefrom.

Thereafter, in a state where the opening and closing valve 14 of the supply pipe 13 is closed, the opening and closing valve 22 of the recovery pipe 21 and the valve gate 15 are opened. Thereby, excess molten metal M pressurized by the inert gas in the processing chamber 114 is pressed out through the valve gate 15 and flows back, and is recovered into the supply tank 11 through the recovery pipe 21 branching from the supply pipe 13 between the valve gate 15 and the supply pump 12. At this time, since the throttle valve 23 is provided in the recovery pipe 21, the pressure of the molten metal M in the processing chamber 5 is maintained at a predetermined pressure.

It is noted that, if the liquid surface of the molten metal M is lowered and the inert gas is exhausted through the valve gate 15, the inert gas enters the supply pipe 13, the supply pump 12 and the supply tank 11, and therefore it is preferred that the recovery operation is stopped before the inert gas is exhausted through the valve gate 15.

Further, when the liquid surface of the molten metal M is lowered due to the discharging and it approaches the surface of the semiconductor wafer K, there is the fear that the molten metal M in the minute spaces is replaced by the inert gas. Therefore, for preventing this disadvantage, it is preferred that a sealing member, for example, an O-ring, is provided at the outer periphery of the lower surface of the pressing member 113 and the region where the minute spaces formed on the surface of the semiconductor wafer K exist is surrounded and sealed by the sealing member when the lower surface of the pressing member 113 is brought into contact with the surface of the semiconductor wafer K. In this configuration, the region surrounded by the sealing member can be airtightly separated from the outside region where the inert gas exists, and therefore the above-mentioned replacement does not occur.

Thus, the function of the gas supply mechanism 40 directly involves the recovery of the molten metal M, and the recovery of the molten metal M is achieved by cooperation between the gas supply mechanism 40 and the molten metal recovery mechanism 20. Therefore, the gas supply mechanism 40 serves a part of the molten metal recovery function in the present invention.

After recovering excess molten metal M in the processing chamber 114 in this manner, the opening and closing valve 22 and the valve gate 15 are closed, and thereafter, the valve gate 28 is opened and the inert gas supplied into the processing chamber 114 is exhausted into the disposal tank 26. Thereby, the inside of the processing chamber 114 is scavenged by the inert gas, and a small amount of the molten metal M remaining in the processing chamber 114 is recovered into the disposal tank 26 through the valve gate 28 and the disposal pipe 27 by the flow of the inert gas.

It is noted that, also in the scavenging operation, providing the sealing member, for example, an O-ring, at the outer periphery of the lower surface of the pressing member 113 as described above prevents the occurrence of the replacement of the molten metal M in the minute spaces with the inert gas due to the scavenging.

Thereafter, the valve gate 28, the opening and closing valve 43 and the valve gate 35 are closed, and then the heating of the processor body 110 is stopped and the processor body 110 is cooled to a temperature equal to or lower than the melting point of the molten metal M and the molten metal M filled in the semiconductor wafer K is cured. Thereafter, the pressing member 113 is moved upward to the waiting position by the presser 7, and then the holding member 111 is moved downward by the lifting mechanism (not shown) and is separated from the cylindrical member 112, and the semiconductor wafer K on the holding member 111 is detached and the metal filling processing for one semiconductor wafer K is finished. In a case where the filling processing is successively performed on a plurality of semiconductor wafers K, the above-described processing is repeatedly performed.

3. Summary

As described in detail above, also according to the metal filling apparatus 100 of this embodiment, since excess molten metal M on the semiconductor wafer K is recovered from the semiconductor wafer K to the supply tank 11 by the functions of the presser 7 and the molten metal recovery mechanism 20 and reused, it is possible to reduce waste of a metal material used and it is possible to reduce material costs in metal filling.

Further, since the pressing member 113 is brought into contact with the surface of the semiconductor wafer K at the time of recovering the molten metal M, the amount of excess metal which has not been filled into the minute spaces and remains on the semiconductor wafer K can be made very small, and material costs necessary for metal filling can be reduced to the utmost limit. Further, it is possible to minimize labor of removing an unnecessary cured metal from the semiconductor wafer K after cooling.

Furthermore, since the throttle valve 23 is provided in the recovery pipe 21, the vacuum pressure inside the supply tank 11 does not act on the inside of the processing chamber 114 even when, at the time of recovering the molten metal M, the supply tank 11 and the processing chamber 114 are brought into a communicating state by opening the opening and closing valve 22, and therefore it is possible to maintain the inside of the processing chamber 114 at the pressurized state and thereby maintain good fillingness.

Next, variations of the metal filling apparatus 100 will be described.

Variation 1 in Second Embodiment

Figure 10:
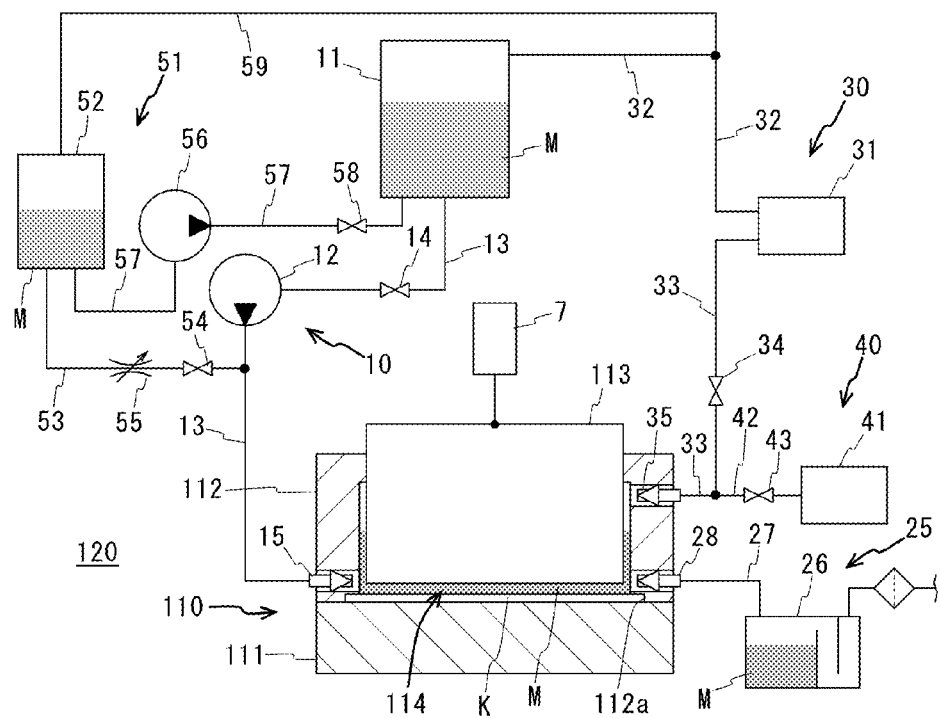
FIG. 10 is an illustration showing a configuration of a metal filling apparatus according to Variation 1 of the second embodiment.

FIG. 10 is an illustration showing a configuration of a metal filling apparatus 120 according to this variation. It is noted that the metal filling apparatus 120 has, instead of the molten metal recovery mechanism 20 of the above-described metal filling apparatus 100, the molten metal recovery mechanism 51 of the above-described metal filling apparatus 50. Therefore, the same components as those of the above-described metal filling apparatus 1 and metal filling apparatus 100 are indicated by the same references and detailed explanations thereof are omitted. Further, the metal filling operation and the molten metal disposal operation are the same as in the metal filling apparatus 100, and therefore detailed explanations thereof are omitted and the molten metal recovery operation will be mainly described.

According to the metal filling apparatus 120, the molten metal M is supplied into the processing chamber 114 by performing the same operation as in the metal filling apparatus 100 in a state where the opening and closing valve 54 is closed. Thereafter, in a state where the opening and closing valve 14 and the valve gate 15 are closed, the valve gate 35 and the opening and closing valve 43 are opened and a pressurized inert gas is supplied into the processing chamber 114 from the gas supplier 41 through the gas supply pipe 42, thereby pressurizing the inside of the processing chamber 114. Thereby, the molten metal M in the processing chamber 114 is pressurized and the molten metal M in the processing chamber 114 is filled into all regions in the minute spaces by the gas pressure.

Subsequently, the pressing member 113 is moved downward to the pressing position by the presser 7 and the lower surface thereof is brought into contact with the surface of the semiconductor wafer K. Thereby, excess molten metal M on the semiconductor wafer K is pressed out therefrom.

Then, the opening and closing valve 54 of the recovery pipe 53 and the valve gate 15 are opened. Thereby, excess molten metal M pressurized by the inert gas in the processing chamber 114 is pressed out though the valve gate 15 and flows back, and is recovered into the recovery tank 52 through the recovery pipe 53 branching from the supply pipe 13 between the valve gate 15 and the supply pump 12. At this time, since the throttle valve 55 is provided in the recovery pipe 53, the pressure of the molten metal M in the processing chamber 114 is maintained at a predetermined pressure.

Then, when a predetermined amount of the molten metal M has been recovered into the recovery tank 52 in this manner, the return pump 56 is driven in a state where the opening and closing valve 58 is opened, and the molten metal M in the recovery tank 52 is returned to the supply tank 11 through the return pipe 57.

Thus, also according to the metal filling apparatus 120, the same effect as that of the above-described metal filling apparatus 1 and metal filling apparatus 100 is achieved.

It is noted that, in the metal filling apparatus 120, the return mechanism section comprising the return pump 56, the return pipe 57 and the opening and closing valve 58 is not always necessary, the molten metal M in the recovery tank 52 may be manually returned to the supply tank 11 at the time when an appropriate amount of the molten metal M has been recovered into the recovery tank 52.

Variation 2 in Second Embodiment

Figure 11:
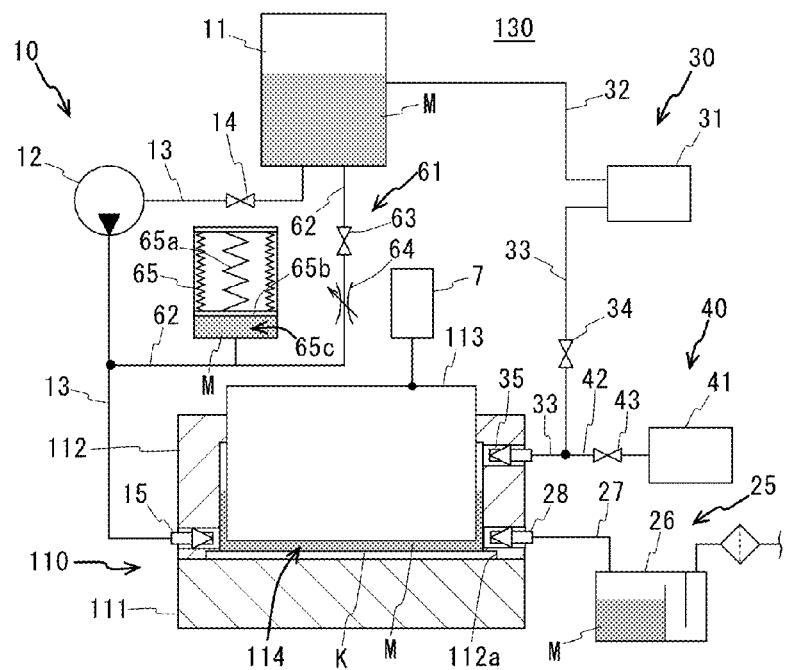
FIG. 11 is an illustration showing a configuration of a metal filling apparatus according to Variation 2 of the second embodiment.

FIG. 11 is an illustration showing a configuration of a metal filling apparatus 130 according to this variation. It is noted that the metal filling apparatus 130 has, instead of the molten metal recovery mechanism 20 of the above-described metal filling apparatus 100, the molten metal recovery mechanism 61 of the above-described metal filling apparatus 60. Therefore, the same components as those of the above-described metal filling apparatus 1 and metal filling apparatus 100 are indicated by the same references and detailed explanations thereof are omitted. Further, the metal filling operation and the molten metal disposal operation are the same as in the metal filling apparatus 100, and therefore detailed explanations thereof are omitted and the molten metal recovery operation will be mainly described.

According to the metal filling apparatus 130, the molten metal M is supplied into the processing chamber 114 by performing the same operation as in the metal filling apparatus 101 in a state where the opening and closing valve 63 is closed. Then, in a state where the opening and closing valve 14 and the valve gate 15 are closed, the valve gate 35 and the opening and closing valve 43 are opened and a pressurized inert gas is supplied into the processing chamber 114 from the gas supplier 41 through the gas supply pipe 42, thereby pressurizing the inside of the processing chamber 114. Thereby, the molten metal M in the processing chamber 114 is pressurized and the molten metal M in the processing chamber 114 is filled into all regions in the minute spaces by the gas pressure.

Subsequently, the pressing member 13 is moved downward to the pressing position by the presser 7 and the lower surface thereof is brought into contact with the surface of the semiconductor wafer K. Thereby, excess molten metal M on the semiconductor wafer K is pressed out therefrom.

Subsequently, in a state where the opening and closing valve 14 and the opening and closing valve 63 are closed, the valve gate 15 is opened. Thereby, excess molten metal M pressurized by the inert gas in the processing chamber 114 is pressed out through the valve gate 15 and flows back, and is temporally recovered in the containing space 65c of the buffer tank 65 thought the recovery pipe 62 branching from the supply pipe 13 between the valve gate 15 and the supply pump 12. It is noted that, naturally, the pressure of the inert gas supplied from the gas supplier 41 is set to a pressure higher than the pressure acting on the molten metal M in the containing space 65c due to the spring 65a.

After recovering the molten metal M in the processing chamber 114 into the containing space 65c of the buffer tank 65 in this manner, when the opening and closing valve 63 is opened in a state where the valve gate 15 is closed, the molten metal M recovered in the buffer tank 65 is pressed out into the recovery pipe 62 by the biasing force of the spring 65a and is recovered into the supply tank 11 through the recovery pipe 62.

Thus, also according to the metal filling apparatus 130, the same effect as that of the above-described metal filling apparatus 1 metal filling apparatus 100 is achieved.

Variation 3 in Second Embodiment

Figure 12:
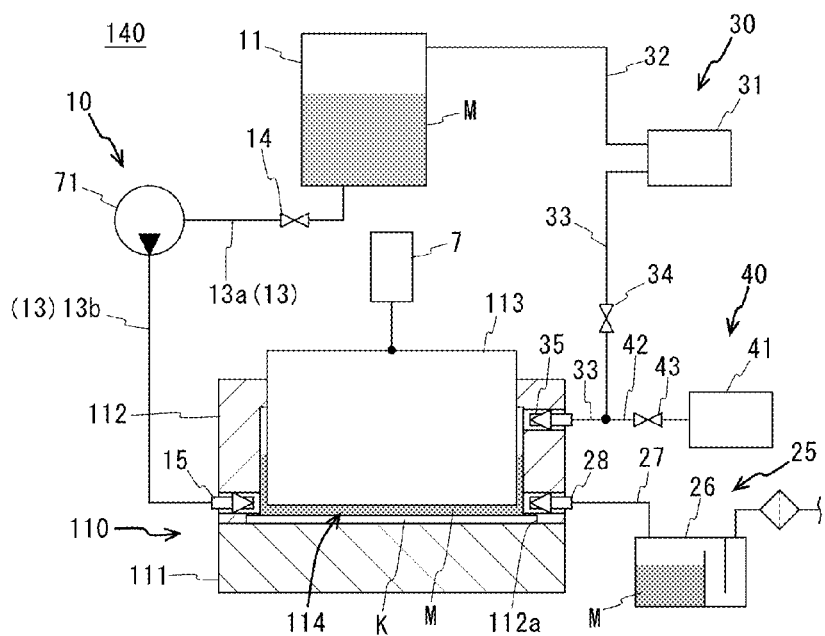
FIG. 12 is an illustration showing a configuration of a metal filling apparatus according to Variation 3 of the second embodiment.

FIG. 12 is an illustration showing a configuration of a metal filling apparatus 140 according to this variation. It is noted that the metal filling apparatus 140 has a configuration in which the molten metal recovery mechanism 20 is removed from the configuration of the above-described metal filling apparatus 100, the plunger pump 71 of the above-described metal filling apparatus 70 is used as a supply pump, and the plunger pump 71 has a function of a metal recovery mechanism. Therefore, the same components as those of the above-described metal filling apparatus 1 and metal filling apparatus 100 are indicated by the same references and detailed explanations thereof are omitted. Further, the metal filling operation and the molten metal disposal operation are the same as in the metal filling apparatus 100, and therefore detailed explanations thereof are omitted and the molten metal recovery operation will be mainly described.

According to the metal filling apparatus 140, the molten metal M is supplied into the processing chamber 114 by performing the same operation as in the metal filling apparatus 70.

Subsequently, in a state where the opening and closing valve 14 and the valve gate 15 are closed, the valve gate 35 and the opening and closing valve 43 are opened and a pressurized inert gas is supplied into the processing chamber 114 from the gas supplier 41 through the gas supply pipe 42, thereby pressurizing the inside of the processing chamber 114. Thereby, the molten metal M in the processing chamber 114 is pressurized and the molten metal M in the processing chamber 114 is filled into all regions in the minute spaces by the gas pressure.

Subsequently, the pressing member 113 is moved downward to the pressing position by the presser 7 and the lower surface thereof is brought into contact with the surface of the semiconductor wafer K. Thereby, excess molten metal M on the semiconductor wafer K is pressed out therefrom.

Thereafter, the valve gate 15 is opened. Thereby, excess molten metal M pressurized by the inert gas in the processing chamber 114 is pressed out through the valve gate 15 and flows back, and flows into the pressurization room 72b of the plunger pump 71 through the supply pipe 13. It is noted that the pressure of the inert gas supplied from the gas supplier 41 is set to a pressure higher than the discharge pressure of the plunger pump 71, and thereby the plunger 73 is moved upward and the pressure oil in the pressurization side of the cylinder room 72a is pressed back to the upstream side from the pressurization side port 72c, and accordingly the capacity of the pressurization room 72b is increased, and, as described above, the molten metal M in the processing chamber 5 flows back and flows into the pressurization room 72a of the plunger pump 71.

After temporally recovering excess molten metal M in the processing chamber 5 into the pressurization room 72s of the plunger pump 71 in this manner, when the opening and closing valve 14 is opened in a state where the valve gate 15 is closed, the plunger 73 of the plunger pump 71 is moved downward by the pressure oil acting on the pressurization side of the cylinder room 72a and presses out the molten metal M in the pressurization room 72b into the supply pipe 13, and the molten metal pressed out is recovered into the supply tank 11 through the supply pipe 13.

Thus, also according to the metal filling apparatus 140, the same effect as that of the above-described metal filling apparatus 1 and metal filling apparatus 100 is achieved.

Another Variation in First and Second Embodiments

Next, another variation in the above-described first and second embodiments will be described. This variation is a mode in which the one ends of the recovery pipes 21, 53, 62 in the above-described metal filling apparatuses 1, 50, 60, 100, 120, 130 are connected to respective processing bodies 2, 110.

Figure 13:
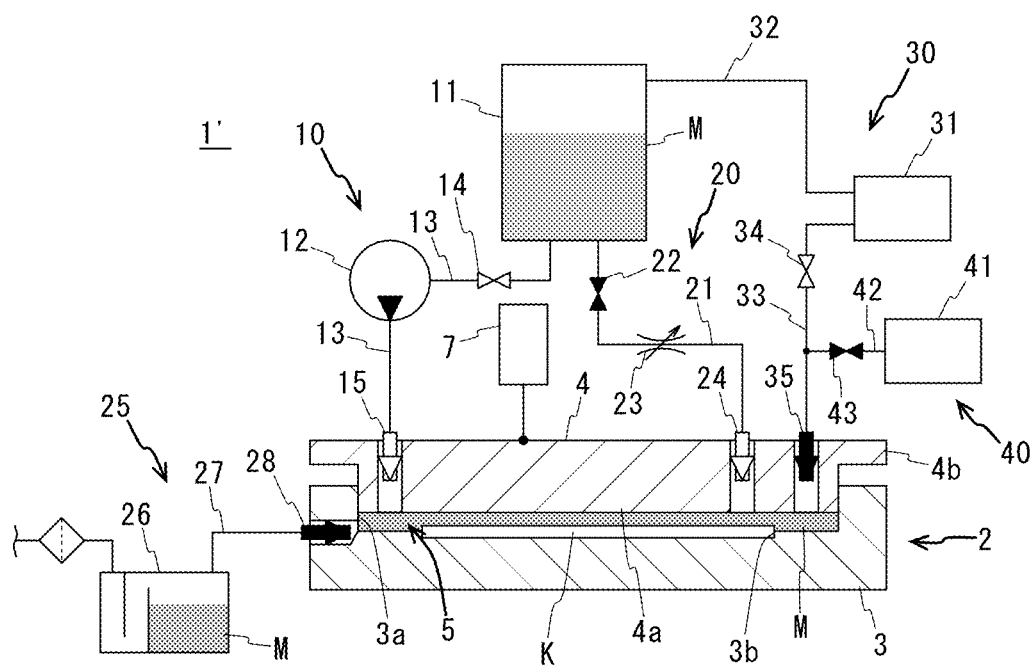
FIG. 13 is an illustration showing a configuration of a metal filling apparatus according to another variation of the first and second embodiments.

FIG. 13 shows, as a representative one of this variation, a metal filling apparatus 1' having a configuration in which the one end of the recovery pipe 21 of the metal filling apparatus 1 is connected to the valve gate 24 provided on the second body 4 to lead to the processing chamber 5. It is noted that this configuration can be applied to the metal filling apparatuses 50, 60, 100, 120, 130.

In the metal filling apparatus 1', in a state where the second body is positioned at the waiting position, and the opening and closing valves 34, 43 and the valve gates 28, 35 are closed and the opening and closing valves 14, 22 and the valve gates 15, 24 are opened, the supply pump 12 is driven and thereby the molten metal M in the supply tank 11 is pressurized and supplied into the processing chamber 5, and when the processing chamber 5 has been filled with the molten metal M, excess molten metal M is recovered into the supply tank 11 through the recovery pipe 21. Continuing the supply of the molten metal M for a while after the processing chamber 5 is filled with the molten metal M generates a flow of the molten metal M in the processing chamber 5, and in a case where the molten metal M stays in the supply pipe 13, the staying molten metal M can be returned to the supply tank 11 and it is possible to make the quality of the molten metal M as filling material uniform.

Subsequently, after supplying the molten metal M in the above-described manner, the valve gates 15, 24 is closed and the second body 4 is biased downward, thereby pressurizing the molten metal M in the processing chamber 5, and thereafter, when the second body 4 is moved downward in a state where the valve gate 24 is opened, excess molten metal M in the processing chamber 5 flows out through the valve gate 24 and is recovered into the supply tank 11 through the recovery pipe 21.

It is noted that, in the metal filling apparatuses 100, 120, 130, the valve gate 24 is provided on the cylindrical member 112 so that it is positioned at the same height as the valve gate 15. Then, the valve gate 24 and the opening and closing valve 22 are opened in a state where the valve gate 15 is closed, excess molten metal M in the processing chamber 114 flows out through the valve gate 24 due to the inert gas supplied from the gas supplier 41 and is recovered as appropriate.

Thus, although specific embodiments of the present invention have been described, a mode in which the present invention can be realized is not limited thereto.

In further addition, the numbers of the pipes and the valves in the above embodiments are not limited to those in the above embodiments, and they may be provided as appropriate as needed. Further, the positions at which the valve gates 15, 28, 35 are provided are not limited to those in the above embodiments, and may be changed as appropriate.

Further, although the above metal filling apparatuses 1, 50, 60, 70 have the configuration in which the second body 4 is moved by the presser 7, the configuration is not limited thereto and they may have a configuration in which the first body 3 is moved by the presser 7 and the first body 3 and the second body 4 have the positional relationships of the waiting position and the pressing position.

INDUSTRIAL APPLICABILITY

As described above, the present invention can be preferably applied to a metal filling apparatus which fills a molten metal into a minute space (via, through hole) formed on a surface of an object to be processed.

The invention claimed is:

1. A metal filling apparatus filling a molten metal into a minute space formed on a surface of an object to be processed to have an opening in said object surface, comprising:
   a processor body having a recess portion defining an airtight processing chamber in which the object to be processed is held, the processor body including a first body holding the object to be processed within the recess portion, and a second body having a pressing portion to be airtightly fitted into the recess portion,
   a molten metal supply including a supply tank in which a metal in a molten state is stored, a supply pipe one end of which is connected to the supply tank and the other end of which is connected to the airtight processing chamber of the processor body, and a supplier which is interposed in the supply pipe and which supplies the molten metal in the supply tank into the airtight processing chamber through the supply pipe; and
   a molten metal return configured to recover the molten metal supplied into the airtight processing chamber, the molten metal return including a first actuator operably coupled to at least one of the first and second bodies to cause relative motion between the first and second bodies in both approaching and separating directions, the first actuator being configured to cause at least one of the first and second bodies to approach the other of them so as to push the molten metal supplied into the airtight processing chamber out of the airtight processing chamber, and functioning as part of the molten metal return.

2. The metal filling apparatus according to claim 1, in which the first actuator is configured to move at least one of the first and second bodies to a pressing position at which the pressing portion of the second body is brought into contact with the surface of the object to be processed in the first body, and to a waiting position at which the first and second bodies are separated from each other.

3. The metal filling apparatus according to claim 1, in which the molten metal return includes a recovery pipe one end of which is connected to the supply pipe between the processor body and the supplier or to the airtight processing chamber of the processor body and the other end of which is connected to the supply tank, and a recovery control valve interposed in the recovery pipe and configured to control an open and closed state of the recovery pipe.

4. The metal filling apparatus according to claim 3, in which the molten metal return further has a buffer tank which is connected to the recovery pipe between the recovery control valve and the supply pipe or the processor body or to the supply pipe between the processor body and the supplier and which temporarily contains the molten metal recovered from the processor body, and the buffer tank is equipped with a push-back device pushing the molten metal contained in the buffer tank back to the pipe connecting to the buffer tank.

5. The metal filling apparatus according to claim 4, in which the push-back device comprises a spring and a movable plate biased by the spring, or comprises a push-back actuator and a movable plate to which an acting force is applied by the push-back actuator.

6. The metal filling apparatus according to claim 1, in which the molten metal return includes a recovery tank in which a metal in a molten state is stored, a recovery pipe one end of which is connected to the supply pipe between the processor body and the supplier or to the airtight processing chamber of the processor body and the other end of which is connected to the recovery tank, and a recovery control valve interposed in the recovery pipe and configured to control an open and closed state of the recovery pipe.

7. The metal filling apparatus according to claim 6, in which the molten metal return further includes a return pipe one end of which is connected to the recovery tank and the other end of which is connected to the supply tank, and a returner which is interposed in the return pipe and returns the molten metal in the recovery tank to the supply tank through the return pipe.

8. The metal filling apparatus according to claim 1, in which the supplier is configured to be capable of accepting the molten metal flowing back and function as a part of the molten metal return.

9. A metal filling apparatus filling a molten metal into a minute space formed on a surface of an object to be processed to have an opening in said object surface, comprising:
   a processor body equipped with a processing chamber in which the object to be processed is held, the processor body including a holder configured to hold the object to be processed, a cylindrical member having an inner space and provided to have one end facing the holder, and a pressing member airtightly inserted in the inner space of the cylindrical member to be movable forward and backward, the object to be processed held by the holder or the holder, the cylindrical member and the pressing member forming an airtight processing chamber;
   a molten metal supply including a supply tank in which a metal in a molten state is stored, a supply pipe one end of which is connected to the supply tank and the other end of which is connected to the processing chamber of the processor body, and a supplier which is interposed in the supply pipe and which supplies the molten metal in the supply tank into the processing chamber through the supply pipe;
   a molten metal return configured to recover the molten metal supplied into the processing chamber;
   a gas supply connected to the processing chamber and supplying a pressurized gas into the processing chamber;
   a pressing member actuator moving the pressing member forward and backward with respect to the object to be processed held by the holder;
   the pressing member actuator being configured to move the pressing member to a pressing position at which the pressing member is brought into contact with the surface of the object to be processed and to a waiting position at which the pressing member is separated from the object to be processed, and the pressing member actuator being configured to push the molten metal supplied into the processing chamber out of the processing chamber; and
   the gas supply being configured to function as a part of the molten metal return.

10. The metal filling apparatus according to claim 9, in which the pressing member has a pressing member surface with a seal to be brought into contact with the object to be processed, the seal, when the pressing member is brought into contact with the object to be processed, surrounding and sealing a region in which the minute space formed on the surface of the object to be processed exists.

11. The metal filling apparatus according to claim 9, in which the molten metal return includes a recovery pipe one end of which is connected to the supply pipe between the processor body and the supplier or to the processing chamber of the processor body and the other end of which is connected to the supply tank, and a control valve for recovery which is interposed in the recovery pipe and controls an open and closed state of the recovery pipe.

12. The metal filling apparatus according to claim 11, in which the molten metal return further has a buffer tank connected to the recovery pipe between the control valve for recovery and the supply pipe or the processor body or to the supply pipe between the processor body and the supplier and which temporally contains the molten metal recovered from the processor body, and the buffer tank is equipped with a push-back device pushing the molten metal contained in the buffer tank back to the pipe connecting to the buffer tank.

13. The metal filling apparatus according to claim 9, in which the molten metal return includes a recovery tank in which a metal in a molten state is stored, a recovery pipe one end of which is connected to the supply pipe between the processor body and the supplier or to the processing chamber of the processor body and the other end of which is connected to the recovery tank, and a control valve for recovery which is interposed in the recovery pipe and controls an open and closed state of the recovery pipe.

14. The metal filling apparatus according to claim 13, in which the molten metal return further includes a return pipe one end of which is connected to the recovery tank and the other end of which is connected to the supply tank, a returner which is interposed in the return pipe and returns the molten metal in the recovery tank to the supply tank through the return pipe, and a control valve for return which is interposed in the return pipe and controls an open and closed state of the return pipe.

15. The metal filling apparatus according to claim 9, in which the supplier is configured to be capable of accepting the molten metal flowing back and function as a part of the molten metal return.

* * * * *